(12) United States Patent
Kim et al.

(10) Patent No.: US 6,664,942 B1
(45) Date of Patent: Dec. 16, 2003

(54) SIGNAL TRANSMISSION FILM AND A LIQUID CRYSTAL DISPLAY PANEL HAVING THE SAME

(75) Inventors: Sang-Soo Kim, Seoul (KR); Choong-Seob Oh, Kyonggi-do (KR); Jin-Hyeok Park, Kyonggi-do (KR); Jin-Ho Park, Kyonggi-do (KR); Dong-Gyu Kim, Kyonggi-do (KR); Yong-Eun Park, Kyonggi-do (KR); Nam-Soo Kang, Seoul (KR); Gyu-Su Lee, Kyonggi-do (KR); Sin-Gu Kang, Kyonggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 210 days.

(21) Appl. No.: 09/612,296

(22) Filed: Jul. 7, 2000

Related U.S. Application Data

(63) Continuation-in-part of application No. 09/551,404, filed on Apr. 17, 2000.

(51) Int. Cl.[7] .................................................. G09G 3/36
(52) U.S. Cl. ........................ 345/92; 345/87; 345/50; 345/55; 345/204; 345/206; 361/749; 361/750
(58) Field of Search .............................. 345/87, 92, 50, 345/55, 76, 77, 84, 204, 206, 105; 361/749, 750

(56) References Cited

U.S. PATENT DOCUMENTS

| | | | | |
|---|---|---|---|---|
| 5,565,885 A | * | 10/1996 | Tamanoi | 345/100 |
| 5,592,199 A | * | 1/1997 | Kawaguchi et al. | 29/846 |
| 5,670,994 A | * | 9/1997 | Kawaguchi et al. | 345/206 |
| 5,701,167 A | * | 12/1997 | Yamazaki | 349/149 |
| 5,712,493 A | * | 1/1998 | Mori et al. | 257/59 |
| 5,754,171 A | * | 5/1998 | Stoller | 345/205 |
| 5,841,414 A | * | 11/1998 | Tanaka | 345/206 |
| 6,061,246 A | | 5/2000 | Oh et al. | 174/254 |
| 6,147,724 A | | 11/2000 | Yoshii et al. | 349/58 |
| 6,157,357 A | * | 12/2000 | Kim | 345/87 |
| 6,297,869 B1 | | 10/2001 | Choo et al. | 349/187 |
| 6,313,526 B1 | | 11/2001 | Nakamura | 206/714 |
| 6,335,773 B1 | | 1/2002 | Kamei et al. | 349/123 |
| 6,366,264 B1 | * | 4/2002 | Kurumada | 315/169.4 |

FOREIGN PATENT DOCUMENTS

| | | | | |
|---|---|---|---|---|
| JP | 6258651 | 9/1994 | | G02F/1/1345 |

* cited by examiner

Primary Examiner—Bipin Shalwala
Assistant Examiner—Leon Shapiro
(74) Attorney, Agent, or Firm—McGuire Woods, LLP

(57) ABSTRACT

A liquid crystal display has a signal transmission film and a single integrated PCB for processing a gate driving signal and data driving signal. The signal transmission film includes a base substrate, a gate driver IC formed on said base substrate, an input pattern formed on said base substrate that applies gate driving signals input from an external device to the gate driver IC, a first output pattern formed on said base substrate that outputs a first gate driving signal processed in said gate driver IC, and a second output pattern formed on said base substrate, that outputs a second gate driving signal bypassing the gate driver IC among the gate driving signals.

27 Claims, 12 Drawing Sheets

SIGNAL TRANSMISSION FILM AND A LIQUID CRYSTAL DISPLAY PANEL HAVING THE SAME

CROSS-REFERENCE TO RELATED APPLICATIONS

This application is a continuation-in-part of applicant's Ser. No. 09/551,404, filed in the U.S. Patent & Trademark Office on Apr. 17, 2000.

BACKGROUND OF THE INVENTION

1. Field of the Invention

The present invention relates to a signal transmission film for a compact size liquid crystal display (LCD), and more particularly to a signal transmission film capable of receiving both of gate signal and data signal which are processed in a single integrated printed circuit board and transmitting the processed signals to an LCD panel and another signal transmission film. Further, the invention relates to a liquid crystal display panel to which the signal transmission film is applied.

2. Description of the Related Art

Generally, an LCD is a mostly used type of flat panel display. Especially, the small size, lighter weight and lower power consumption render the LCD to replace the traditional cathode ray tube (CRT). The LCD is currently used as a monitor for a lap-top computer and even for a desktop computer, gaining its popularity.

As shown in FIG. 1, an LCD includes an LCD panel 101 and a light supply unit. The LCD panel 101 includes a TFT substrate 10, a color filter substrate 20, multiple gate tape carrier packages(TCPs) 30 connected to gate lines (not shown) of the TFT substrate 10, multiple data TCPs 40 connected to data lines (not shown) of the TFT substrate 10, a gate PCB 50 connected to the multiple gate TCPs 30, a data PCB 60 connected with the multiple data TCPs 40. The light supply unit includes multiple optical sheets such as a light guiding plate 90, a light diffusing plate (not shown), etc., a lamp assembly 80, and a receiving case called as "mold frame". The light guiding plate 90 has a decreasing thickness as it travels from the lamp unit 80 to the data PCB 60.

A power supply unit and a controller that processes gate signals and data signals coming from an external device are mounted on the data PCB 60. A gate voltage supply part (not shown) is formed on the gate PCB 50 and supplies a gate driving voltage to gate lines by a control signal from the controller on the data PCB 60.

To supply the control signal and the gate driving voltage into the gate PCB 50 from the data PCB 60, connectors 55 and 65 are respectively installed in the gate PCB 50 and data PCB 60 and are connected to each other through a connecting member 70, "flexible printed circuit (FPC)".

Semiconductor fabrication technologies have developed in the areas of thin film formation, and packaging. This allows semiconductor devices to be mounted on the gate PCB 50 and to function as gate power supply source on the data PCB 60.

Under such a configuration, the gate PCB 50 only transfers to the gate TCP 30 gate driving signals processed in the data PCB 60.

The conventional LCD has following problems.

First, in order to apply gate driving signals processed in data PCB 60 to gate PCB 50, gate PCB 50 and data PCB 60 need connectors 55 and 65.

The connectors 55 and 56 are generally installed on the front surface or on the rear surface of the PCBs 50 and 60. This increases the thickness of the LCD and makes it difficult to achieve a compact size LCD.

And the flexible printed circuit (FPC) 70 that connects the connector 55 and the connector 65 complicates the assembly process and increases the fabrication costs.

Finally, a bent type PCB that is mostly used currently bends a gate PCB 50 and data PCB 60 and they are fixed at the rear surface of the reflecting plate of a back light assembly. In such a configuration, the data PCB 60 is put in a space between a relatively thin side edge 92 of the non-symmetric light guiding plate 90 and the mold frame. Thus the data PCB 60 does not increase the thickness of the LCD much. On the other hand, the gate PCB 50 is put in a space between a thickness varying side of the light guiding plate 90, and the mold frame. Specifically, one side of the gate PCB 50 is attached to a thick portion of the rear surface of the light guiding plate 90, making the thickness of LCD depend on the thickness of the light guiding plate 90.

SUMMARY OF THE INVENTION

The present invention is to provide an integrated PCB that has a gate PCB and a data PCB on one board and is capable of allowing driving signals to be applied to gate lines and data lines without using additional connectors and flexible printed circuits.

It is another object of the present invention to allow a signal transmission film that receives a driving signal from the integrated PCB to transmit the received driving signal into another signal transmission film.

It is yet another object of the present invention to prevent delays of driving signals when a driving signal processed in the integrated PCB is sent to gate lines or data lines via signal transmission films.

It is still another object of the present invention to provide an improved assembly between signal transmission films and TFT substrate, thereby attaining an easy carrying and decreasing the thickness of the panel.

To achieve these and other advantages in accordance with the purpose of the present invention as embodied and broadly described, a signal transmission film comprises a base substrate, a driver IC formed on the base substrate, an input pattern formed on the base substrate, for applying driving signals input from an external device to the driver IC, a first output pattern formed on the base substrate, for transferring a first driving signal processed in the driver IC and a second output pattern formed on the base substrate, for transferring a second driving signal that is substantially the same signal with an input signal applied to the input pattern.

Also a liquid crystal display panel assembly and a liquid crystal display using such an assembly are disclosed.

BRIEF DESCRIPTION OF THE DRAWINGS

The above objects and other advantages of the present invention will become more apparent by describing in detail a preferred embodiment with reference to the attached drawings in which.

DETAILED DESCRIPTION OF THE PREFERRED EMBODIMENTS

Reference will now be made in detail to the preferred embodiments of the present invention, examples of which are illustrated in the accompanying drawings.

Hereinafter, a liquid crystal display panel, a signal transmission film and a liquid crystal display according to the present invention are described more fully with reference to the accompanying drawings.

Figure 1:
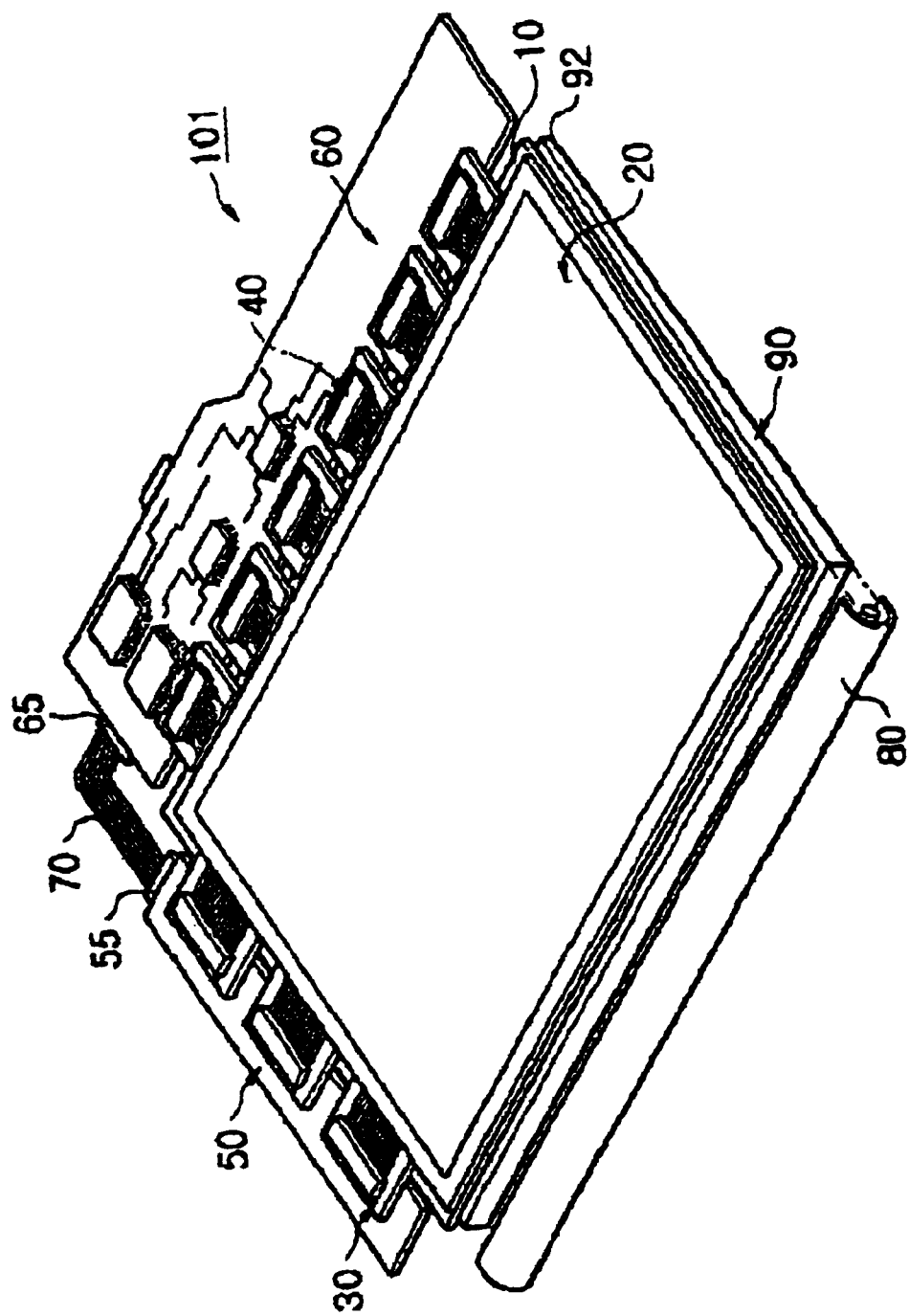
FIG. 1 is a perspective view showing a conventional liquid crystal display panel.
Figure 2:
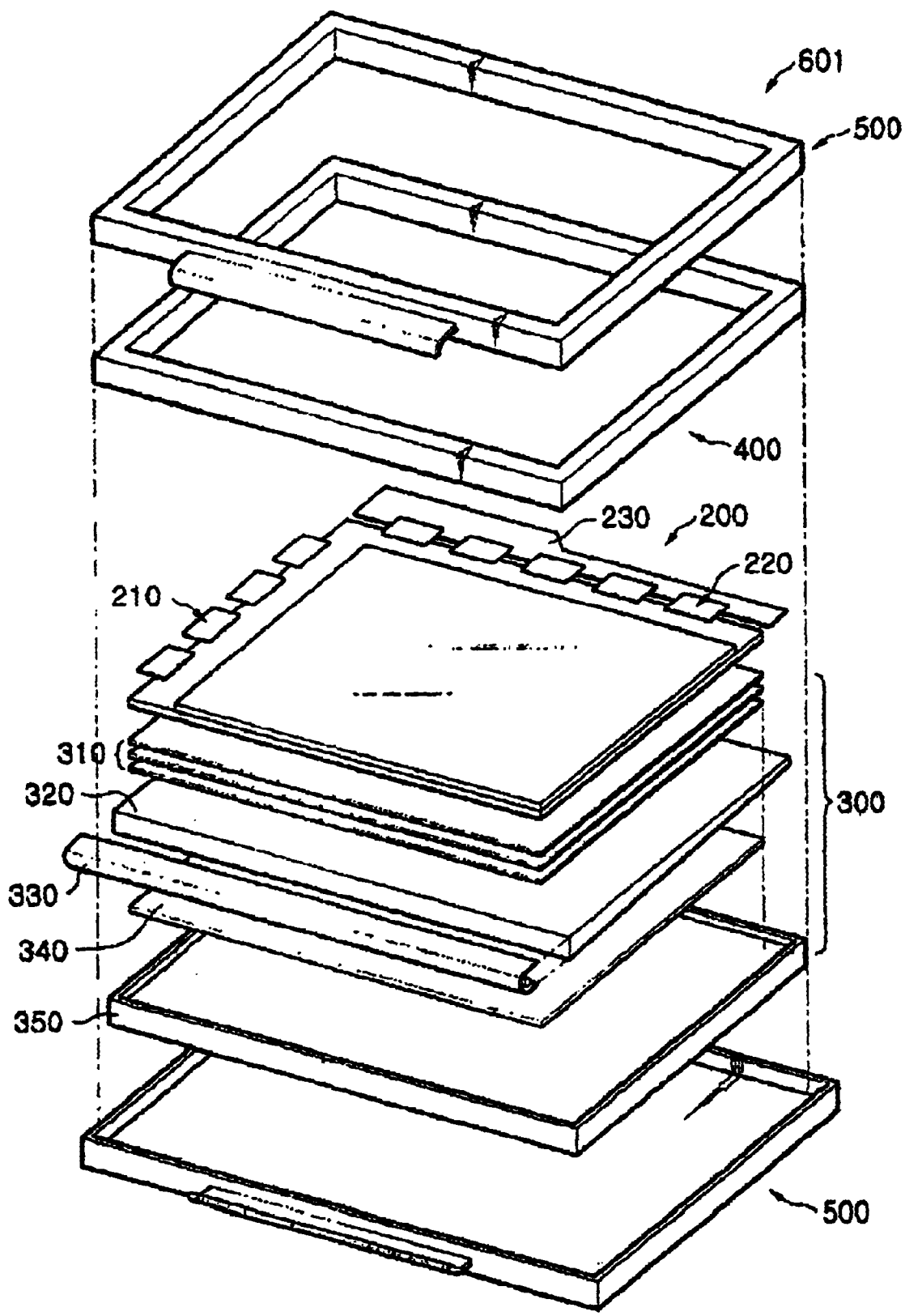
FIG. 2 is an exploded perspective view of the liquid crystal display according to a preferred embodiment of the present invention.

FIG. 2 is an exploded perspective view of the liquid crystal display according to a preferred embodiment of the present invention.

The liquid crystal display 601 comprises a liquid crystal display panel assembly 200, a back light assembly 300, a chassis 400 and a cover 500.

The back light assembly 300 is comprised of optical sheets 310, a light guiding plate 320, a lamp assembly 330, a light reflecting plate 340 and a mold frame 350 as a receiving container.

Hereinafter, the liquid crystal display panel assembly 200 according to the present invention is described referring to the FIG. 3 and the liquid crystal display panel is then described more fully referring to FIG. 4.

Figure 3:
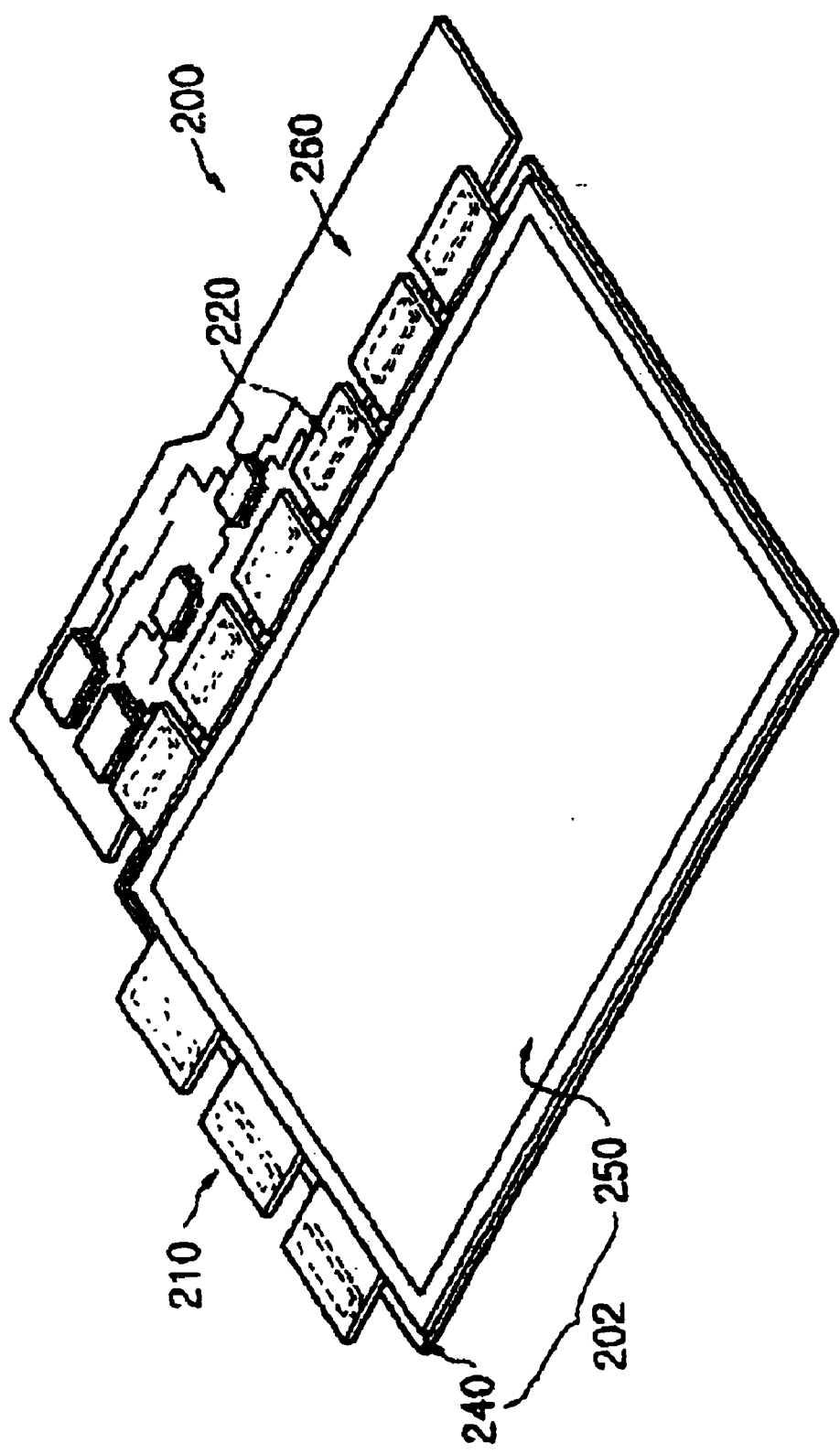
FIG. 3 is a perspective view of the liquid crystal panel according to a preferred embodiment of the present invention.

Referring to FIG. 3, the liquid crystal display panel assembly 200 comprises a liquid crystal display panel 202 having a TFT substrate 240 and a color filter substrate 250, a liquid crystal (not shown) interposed between the TFT substrate 240 and the color filter substrate 250, signal transmission films 210 and 220 and a single integrated PCB 260.

Figure 4:
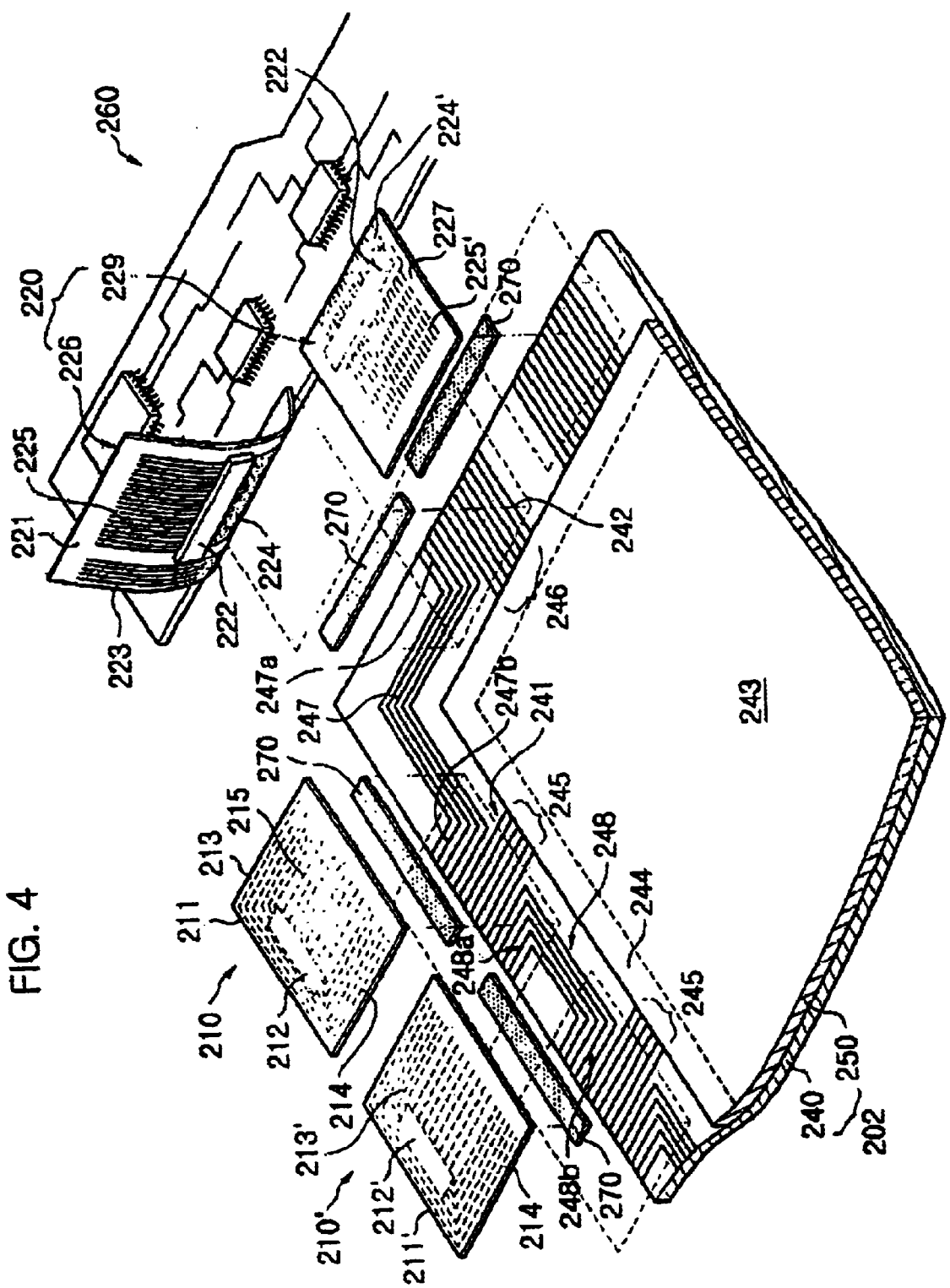
FIG. 4 is a partially exploded perspective view of the liquid crystal display panel according to a preferred embodiment of the present invention.

Referring to FIG. 4, the liquid crystal display panel 202 comprises a TFT substrate 240 and a color filter substrate 250. The color filter substrate 250 is smaller than the TFT substrate 240 and faces the TFT substrate 240. The TFT substrate 240 includes a gate line 241, a data line 242, a thin film transistor (not shown) and a pixel electrode (not shown).

The signal transmission films 210, 210', 226, and 229 are electrically coupled to the TFT substrate 240 and include gate signal transmission films 210 and 210' and data signal transmission films 226 and 229. The gate signal transmission films 210 and 210' are connected to the gate lines on the TFT substrate 240. The data signal transmission films 226 and 229 are connected to the data lines on the TFT substrate 240.

The single integrated PCB 260 that is electrically connected to the data signal transmission films 226 and 229 has various driving elements for processing gate driving signals and data driving signals. The gate driving signals are input to the gate signal transmission film 210 and the data driving signals are input to the data signal transmission film 220.

The color filter substrate 250 includes a transparent glass substrate 250. The transparent glass substrate 250 has a lattice type black matrix (not shown), an RGB pixel (not shown) and a transparent and conductive ITO (Indium Thin Oxide) electrode. Here, the RGB pixels are formed by patterning a photoresist mixed with RBG pigment. The ITO electrode functions as a common electrode.

Meanwhile, the TFT substrate 240 includes a transparent glass substrate. On the transparent glass substrate, a plurality of thin film transistors (not shown) each including a gate, a source, and a drain are formed in a matrix arrangement by the semiconductor thin film formation process.

Gate terminals of all the thin film transistors in a row are connected to a gate line 241 that is extended to an end of the one side of the TFT substrate 240. Source terminals of all the thin film transistors in one column are connected to a data line 242 formed at an end of the other side of the TFT substrate 240. The drain terminal of each thin film transistor is connected to an ITO electrode, which is a pixel electrode. Therefore, the ITO electrode faces the common electrode of the color filter substrate 250.

Further, the gate lines 241 are disposed in an effective display region 243 at the same interval with respect to each other while they are disposed in a perimeter region with a smaller interval than the interval of the gate line of the effective display region 243, i.e., the gate lines 241 in the perimeter region are concentrated towards output terminals of the gate signal transmission films 210 and 210'.

The preferred embodiment of the present invention has three gate line groups, although FIG. 4 shows only two gate line groups 245.

Also, the data lines 242 are disposed in the effective display region 243 at the same interval with respect to each other. The data lines 242 are collected toward output terminals of the TCPs 226 and 229 on the perimeter region 244 and form a data line group 246 on the perimeter region 244 and connected to the data signal transmission films 226 and 229.

Figure 6:
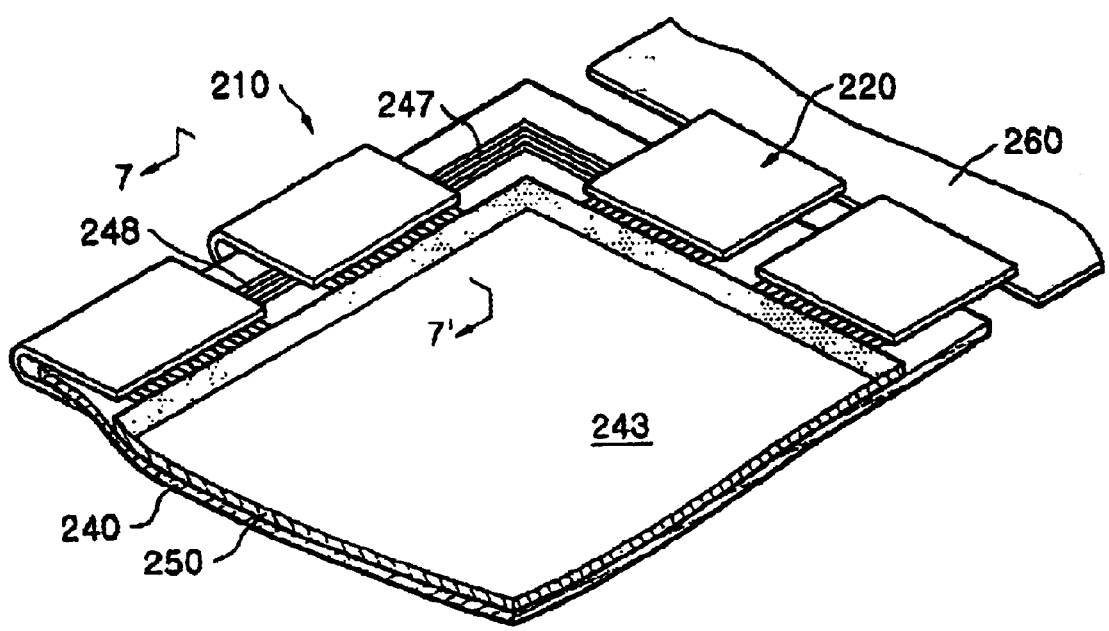
FIG. 6 is a perspective view showing an assembly of signal transmission film and TFT substrate of the liquid crystal display panel according to a preferred embodiment of the present invention.

The preferred embodiment of the present invention has six data line groups and FIG. 6 shows only two data line groups 246.

Some lines of a gate line group 245 placed at one edge and some lines of a data line group 246 placed at one edge around a corner of the TFT substrate 240 are connected to each other, thereby forming a first gate driving signal transmission line 247.

One end of the first gate driving signal transmission line 247 extends to one side of the TFT substrate 240 in which the end of the outermost gate line group 245 is formed. The other end of the first gate driving signal transmission line 247 extends to one side of the TFT substrate 240 in which the end of the outermost data line group 246 adjacent to the gate line group 245 is disposed.

In the first gate driving signal transmission line 247, an input terminal 247a that receives a signal is defined as one end portion of the first gate driving signal transmission line 247. And an output terminal 247b is defined as the other end of the first gate driving signal transmission line 247.

Meanwhile, a second gate driving signal transmission line 248 is formed at the space between the two gate line groups 245.

One end of the second gate driving signal transmission line 248 is formed at one side of the TFT substrate 240 and extends to a desired length in parallel with the gate line group 245. The second gate driving signal transmission line 248 is bent perpendicularly to the adjacent gate line group 245 and extends again to a desired length. And the second gate driving signal transmission line 248 is then bent to be parallel with the adjacent gate line group 245 and extends to the other side of the TFT substrate 240.

At this time, an input terminal 248a is defined as one end portion of the second gate driving signal transmission line 248 and an output terminal 248b is defined as the other end portion of the second gate driving signal transmission line 248.

The gate signal transmission films 210 and 210' and data signal transmission films 226 and 229 will be described more fully referring to the FIG. 4.

The gate signal transmission film 210 is comprised of a FPC 211, a gate driver IC 212, a gate driving signal input pattern 213, a first gate driving signal output pattern 215 and a second gate driving signal output pattern (or a bypass line) 214.

The gate driver IC 212 is disposed at the rear surface of the FPC 211 in a flip chip type manner. The first gate driving signal output pattern 215 is disposed at the FPC 211 on which the gate driver IC 212 is disposed. One end of the first gate driving signal output pattern 215 is connected with output terminals of the gate driver IC 212 and the other end of the first gate driving signal output pattern 215 is connected through an anisotropic conductive film 270 to the gate lines group 245.

The gate driving signal input pattern 213 receives the gate driving signal from the output terminal 247b of the first gate driving signal transmission line 247 and sends the signal to the gate driver IC 212.

Thus, one end of the gate driving signal input pattern 213 is connected through the anisotropic conductive film 270 to the output terminal 247b of the first gate driving signal transmission line 247 and the other end of the gate driving signal input pattern 213 is connected to the input terminals of the gate driver IC 212.

The second gate driving signal output pattern 214 relays the gate driving signal from the TCP 226 to the input terminal 248a of the second gate driving signal transmission line 248 formed between the gate lines groups 245.

To realize this, one end of the second gate driving signal output pattern 214 is connected through the anisotropic conductive film 270 to the input terminal 248a of the second gate driving signal transmission line 248 and the other end of the second gate driving signal pattern 214 is connected to the output terminal 247b of the first gate driving signal transmission line 247.

At this time, the second gate driving signal output pattern 214 and the gate driving signal input pattern 213 are formed to be symmetric with respect to the gate driver IC 212.

If an output enable signal (OE signal) is ON, the gate driving signal, which is input through the gate driving signal input pattern 213 to the gate driver IC 212, is processed in the corresponding gate driver IC 212, and then applied to the first gate driving signal output pattern 215. If the OE signal is OFF, the gate driving signal is not applied to the first gate driving signal output pattern 215 but to the second gate driving signal output pattern 214.

Meanwhile, the data signal transmission film includes a plurality of packages, i.e., a dual functioning signal transmission film 226 for processing the gate driving signals and the data driving signals and a single functioning signal transmission film 229 only for the data driving signal.

Referring to FIG. 4, the dual functioning signal transmission film 226 for gate/data driving signals comprises a FPC 221 that is a flexible base film 221, the gate driving signal transmission pattern 223, a data driver IC 222, a data driving signal input pattern 224 and a data driving signal output pattern 225.

Further, the data driver IC 222 is disposed at the rear surface of the FPC 221 in a flip chip type manner. One end of the data driving signal input pattern 224 is connected to input terminals of the data driver IC 222. And the other end of the data driving signal input pattern 224 is connected to the integrated PCB 260.

In addition, one end of the data driving signal output pattern 225 is connected to output terminals of the data driver IC 222, and the other end of the data driving signal output pattern 225 is connected through an anisotropic conductive film 270 to the aforementioned data line group 246.

On the FPC 221 of the dual functioning signal transmission film 226 for the gate/data driving signals, there are formed the data driving signal output pattern 225, the data driving signal input pattern 224, the data driver IC 222 and the gate driving signal transmission pattern 223 that is separate from the data driver IC 222.

One end of the gate driving signal transmission pattern 223 is connected to the single integrated PCB 260. And the other end of the gate driving signal transmission pattern 223 is connected through the anisotropic conductive film 270 to the input terminal 247a of the first gate driving signal transmission line 247.

Meanwhile, the single functioning signal transmission film 229 comprises a FPC 227, a data driver IC 222, a data driving signal input pattern 224' and a data driving signal output pattern 225'.

One end of the data driving signal input pattern 224' is connected to the single integrated PCB 260. And the other end of the data driving signal input pattern 224' is connected to input terminals of the data driver IC 222. One end of the data driving signal output pattern 225' is connected to output terminals of data driver IC 222. And the other end of the data driving signal output pattern 225' is connected through the anisotropic conductive film 270 to the data line group 246.

Therefore, the gate driving signal generated from the single integrated PCB 260 is input through the gate driving signal transmission pattern 223 of the dual functioning signal transmission film 226 for the gate/data driving signal, the input terminal 247a of the first gate driving signal transmission line 247, the output terminal 247b of the first gate driving transmission line 247 and the gate driving signal input pattern 213 of the gate signal transmission film 210 to the gate driver IC 212. The gate driving signal is then input through the first gate driving signal output pattern 215 to the gate line group 245 by the OE signal. Meanwhile, some of the gate driving signal generated from the single integrated PCB 260 are input through the second gate driving signal output pattern 214 to the gate driving signal input pattern 213' or the second gate driving signal output pattern 214' of the adjacent TCP 211'.

The signals that come from the single integrated PCB 260 through the above passages to the gate line group 245 are a gate clock, the OE signal, a $V_{ON}$ signal which is a turn-on signal of the thin film transistor, a $V_{OFF}$ signal which is a turn-off signal of the thin film transistor and a $V_{com}$ which is a common electrode signal.

In addition, the data driving signal generated from the single integrated PCB 260 is input through the signal transmission film 221 for the gate/data driving signal and the single functioning signal transmission film 229 only for the data driving signal to the data line group 246 of the TFT substrate 240.

The signals input from the single integrated PCB 260 through the data driving signal input patterns 224 and 224', the data driver IC 222 and the data driving signal output patterns 225 and 225' to the data line group 246, are a STH (Start Horizontal) signal for exactly latching a color data from an outer data processing unit to the data driver IC 222, a LOAD signal which outputs the signal latched in the data driver IC 222 to the liquid crystal display panel assembly 200, a clock signal for transmitting the data and RGB color data, etc.

Next, operations of the liquid crystal display according to the present invention are described with reference to the accompanying drawings.

Video signals as well as electric power, control signals, and color data are input from an external information processing unit to the single integrated PCB 260. The single integrated PCB 260 then generates gate driving signals and data driving signals depending on the input video signals. Thereafter, the data driving signals generated from the single integrated PCB 260 are respectively input into the respective data driver IC 222 and 222' via the data driving signal input patterns 224 and 224' of data driving signal transmission lines of the dual functioning signal transmission film 226 and the single functioning signal transmission film 229. The processed data driving signals are loaded to selected data lines 242 of the data line group 246 via the data driving signal output patterns 225 and 225'. At this time, gray scale voltages for displaying colors are also applied to respective data lines 242.

Simultaneously, among gate driving signals processed in the single integrated PCB 260, a gate voltage is sent to an input terminal 247a of the first gate driving signal transmission line 247 through the gate driving signal transmission pattern 223. One component of the gate driving signals is a gate voltage. The gate voltage goes along the first gate driving signal transmission line 247 and then is sent to the input terminal of the gate driving signal input pattern 213.

The driving signals inputted to the gate driving signal input pattern 213 are also transferred into the gate driving signal input pattern 213' of the adjacent gate signal transmission film 210' through the second gate driving signal output pattern 214' connected to the input terminal of the gate driving signal input pattern 213 and the input terminal 248a of the second gate driving signal transmission line 248 printed on the TFT substrate 240. By such signal transmissions, all the gate driver IC 212 and 212' are prepared to apply the gate driving signals to the gate lines by the OE signal.

Next, the OE signal is carried in or carried out into the gate driver ICs 212 and 212' via the gate driving signal pattern 223 of the TCP 226, the first gate driving signal transmission line 247, the gate driving signal input pattern 213, and the second gate driving signal transmission line 248 in the named order and thereby pre-designated gate voltages, such as turn-on voltage Von and turn-off voltage Voff are applied to all of the gate lines within a period of one frame.

As the Von signal is input into gate terminals of thin film transistors placed along the rows through the gate lines 241, the thin film transistors are all turned on and the gray scale voltages which have been already applied to the data lines 242 are applied to the pixel electrodes. This generates an electric field proportional to the gray scale voltage, between the pixel electrode and the common electrode.

As the voltages are applied to the pixel electrodes, the liquid crystal interposed between the pixel electrode and the common electrode re-arranges and the light transmittance changes accordingly. As a result, lights may pass through the TFT substrate 240 depending on the light transmittance. Thereafter, the lights pass through the RGB elements formed on the color filter substrate 250 and displays an image. At this time, the electric field between the pixel electrode and the common electrode is maintained for a period of one frame in which all the gate lines 241 are turned on in order.

The above-described operations are performed very quickly and, thus, the liquid crystal display appears to display information in full color.

The gate driving signals processed in the single integrated PCB 260 are input into all the gate lines 241 via the double functioning signal transmission film 226, the gate signal transmission film 210, and the gate driver IC 212.

Then, the transmission pattern and the transmission lines applied to the TFT substrate 240, the gate signal transmission film 210, the dual functioning signal transmission film 226 are formed in a very small space with a fine pitch. This fine pitch pattern and line may form a RC time delay circuit due to a very high resistance of the substrate and the parasitic capacitance formed between the gate transmission lines.

The RC time delay circuit may also cause the turn-on voltage Von and the turn-off voltage Voff of the gate driving signals to be modulated. A delay in transmission of the gate driving signals degrade the picture quality, causing flickers in the effective display region of the panel and a divisional appearance on the effective region of the panel.

Moreover, the modulation in the turn-on voltage and the turn-off voltage affects the gray scale voltage being input into the data lines 242, resulting in a variation in the gray scale. In other words, both of the gate driving signal delay and the modulation in the turn-on and turn-off voltages significantly degrades the picture quality and display colors.

In order to prevent the gate driving signal transmission delay and the modulation of the turn-on voltage and the turn-off voltage, the resistance between the transmission pattern and the transmission lines needs to be decreased. The resistance can be theoretically decreased by enlarging the sectional area of the gate driving signal transmission line and the gate driving signal pattern or sufficiently widening the interval between the gate driving signal transmission lines.

However, such a conventional wisdom consumes the scarce resource of real estate on the TFT substrate 240, making it more difficult to produce a compact and lighter LCD product.

Accordingly, several preferred embodiments are disclosed to resolve such drawbacks. They are described with reference to the accompanying drawing of FIG. 5.

As described referring to FIGS. 2 to 6, the first gate driving signal transmission line 247, the gate driving signal transmission pattern 223, the gate driving signal input pattern 213, the second gate output pattern 214 are grouped in plurality. For example, three gate driving signal line groups comprise a first gate driving signal line group 281, a second gate driving signal line group 282, and a third gate driving signal line group 283. Each of the three groups has a plurality of signal transmission lines.

A plurality of gate driving signals are transferred through the respective corresponding gate driving signal line groups 281, 282, and 283 into the respective corresponding gate driver ICs 212. Here, it is natural for the single integrated PCB 260 to have additional output terminals A, B, and C which are connected to the respective gate driving signal transmission groups.

Specifically, the first gate driving signal lines group 283 is connected to the first gate driver IC of the first gate signal transmission film, the second gate driving signal line group 282 is connected to the second gate driver IC of the second gate signal transmission film, and the third gate driving signal line group 281 is connected to the third gate driver IC of the third gate signal transmission film.

In other words, the plurality of gate driving signal transmission lines are grouped into several groups and respective groups are connected to corresponding gate driver ICs in parallel, thereby minimizing the RC time delay during the transmission of the gate driving signals and preventing the flicker and picture division appearance.

As another embodiment, upon considering the length of the respective gate driving signal lines from the single integrated PCB 260, the first gate driving signal line group 281 is longer than the second gate driving signal line group 282. And the second gate driving signal line group 282 is longer than the third gate driving signal line group 283. In the above configuration, since resistance of the groups of lines is proportional to the length, the first gate driving signal line group 281 has the biggest resistance when the diameter of the lines of the respective groups are the same. Therefore, in order to prevent RC time delay due to a difference in the resistance between the three gate driving signal lines, the diameter of each of signal transmission lines of the first gate driving signal line group is bigger than the second gate driving line group and the diameter of each of signal transmission lines of the second gate driving signal line group is bigger than the third gate driving line group.

Another embodiment to prevent the flicker and the picture division appearance phenomena applies respective gate driving signals corresponding to the respective gate driving signal line groups 281, 282, and 283 to the corresponding gate driving signal line groups 281, 282, and 283 with a time interval. A first gate driving signal corresponding to the first gate driving signal line group 281 is first applied to the first gate driving signal line group 281. A second gate driving signal corresponding to the second gate driving signal line group 282 is secondly applied to the second gate driving signal line group 282 after a first predetermined time elapses after sending the first gate driving signal. Then, a third gate driving signal corresponding to the third gate driving signal line group 283 is finally applied to the third gate driving signal line group 283 after a second predetermined time elapses after sending the second gate driving signal. The first and second predetermined time is determined by respective resistance values calculated considering the lengths and diameters of the first, second, and third gate driving signal line groups 281, 282, and 283.

As still another embodiment to prevent the flicker and the picture division appearance problems, respective gate driving signal line groups 281, 282 and 283 are electrically connected to respective corresponding gate driver ICs in parallel and a turning resistor that controls the timing of the gate driving signals is connected to the respective gate driving signal line groups 281, 282, and 283 or the single integrated PCB 260.

Specifically, Voff signal that turns off the thin film transistor proves to be sensitively affected by the substrate resistance and the signal transmission patterns. As described previously, since the substrate resistance and the pattern resistance are determined by the total length and the diameter of the gate driving signal line groups 281, 282, and 283, the gate driving signal line groups have different signal arriving time, generating the flicker and the picture division appearance problems and degrading the picture quality.

Therefore, the single integrated PCB 260 generates the $V_{off}$ signal considering maximum resistance among the resistances applied to the gate driving signal line groups 281, 282, and 283.

However, although the $V_{off}$ signal is input into respective gate driver ICs through the respective corresponding gate driving signal line groups 281, 282, and 283 considering the maximum resistance, the final $V_{off}$ signal still has a deviation due to the resistance. Accordingly, in order to eliminate the deviation, a turning resistor is provided.

The turning resistor is respectively formed in each of the gate driving signal line groups 281, 282, and 283 and enables to output a $V_{off}$ signal with a minimum deviation, thereby eliminating the flicker and the picture division appearance problems.

Next, a method for operating the LCD panel according to the above preferred embodiments is described.

First, the single integrated PCB 260 generates a gate driving signal and a data driving signal. The data driving signal is transformed into a source signal including a gray scale voltage through the dual functioning data signal transmission film 226 and the single functioning data signal transmission film 229. The source signal is then applied to the data line group 246.

The gate driving signals from the single integrated PCB 260 are concurrently input to all the gate driver ICs 212 of the gate signal transmission films 210 through the first gate driving signal line group 281—to the third gate driving signal line group 283.

Figure 5:
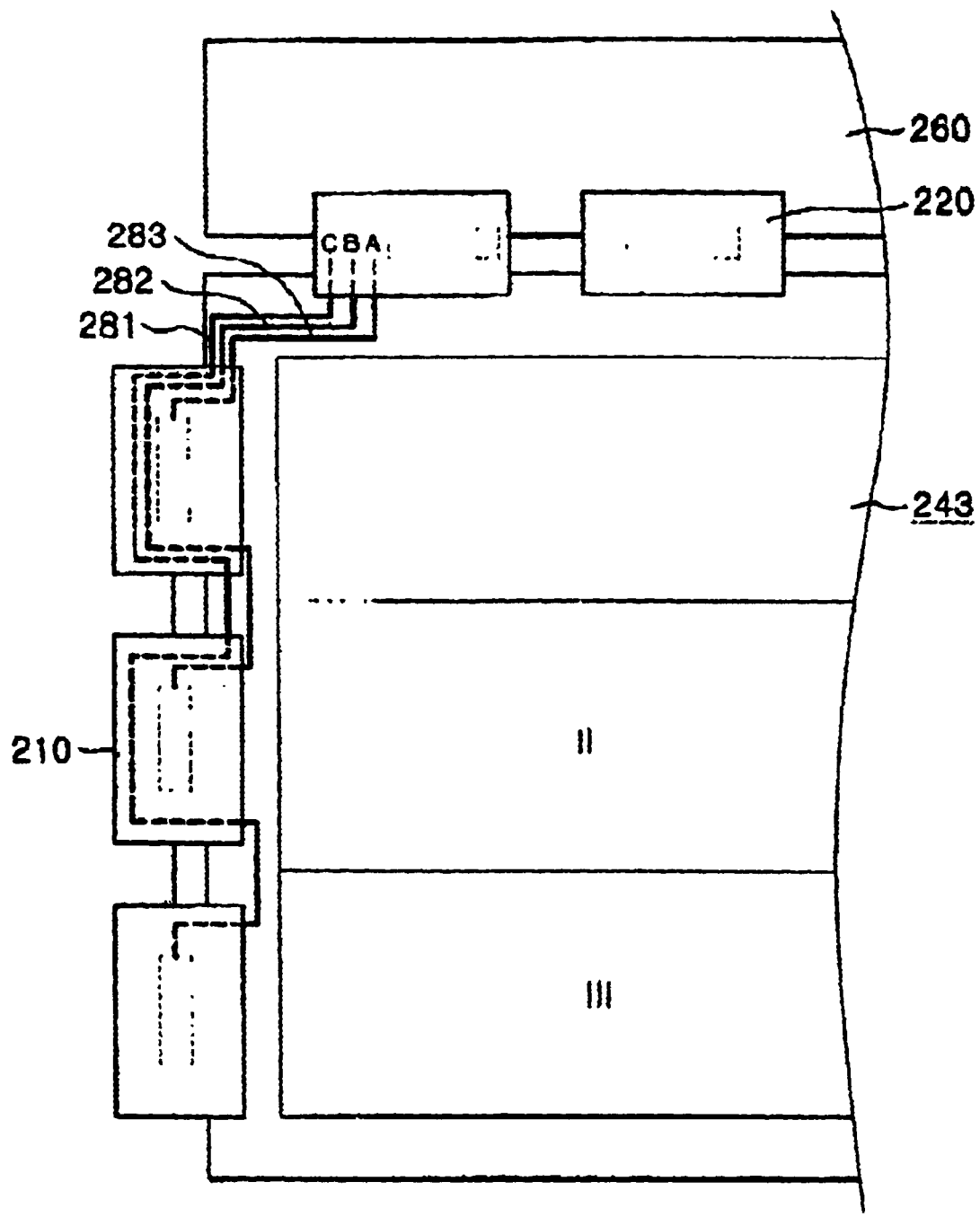
FIG. 5 is a schematic view for describing an operation of the liquid crystal display panel according to a preferred embodiment of the present invention.

The first corresponding gate driving IC receives a first gate driving signal from the single integrated PCB 260 through the third gate driving signal lines group 283 and then applies Von signals to gate lines in portion of "I" of the effective display region in FIG. 5 using OE signal. The image of the portion "I" is maintained for one frame.

The second corresponding gate driving IC receives a second gate driving signal from the single integrated PCB 260 through the second gate driving signal line group 282 and then applies Von signals to gate lines in portion "II" of the effective display region in FIG. 5. The picture of the portion "II" is also maintained for one frame together with the picture of the portion "I".

The third corresponding gate driving IC receives a third gate driving signal transmitted from the single integrated PCB 260 through the first gate driving signal line group 281 and then applies Von signals into gate lines in portion "III" of the effective display region in FIG. 5. The picture of the portion "III" is also maintained for one frame together with the picture of the portion "I" and portion "II".

Because these steps are performed very quickly, it may display a moving picture or a clean still picture on the panel.

The liquid crystal,display panel according to the present invention does not need a gate PCB and only the gate signal transmission films 210 are coupled to the ends of the gate lines 241 formed on the TFT substrate 240.

Figure 7:
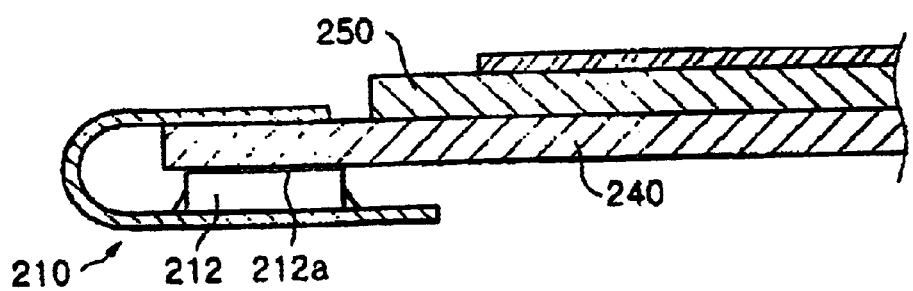
FIG. 7 is a sectional view taken along the line 7–7' of FIG. 6.

Thus, these gate signal transmission films 210 are bent and then attached to the rear surface of the TFT substrate 240 as shown in FIGS. 6 and 7. This would produce a compact liquid crystal display panel.

Figure 8:
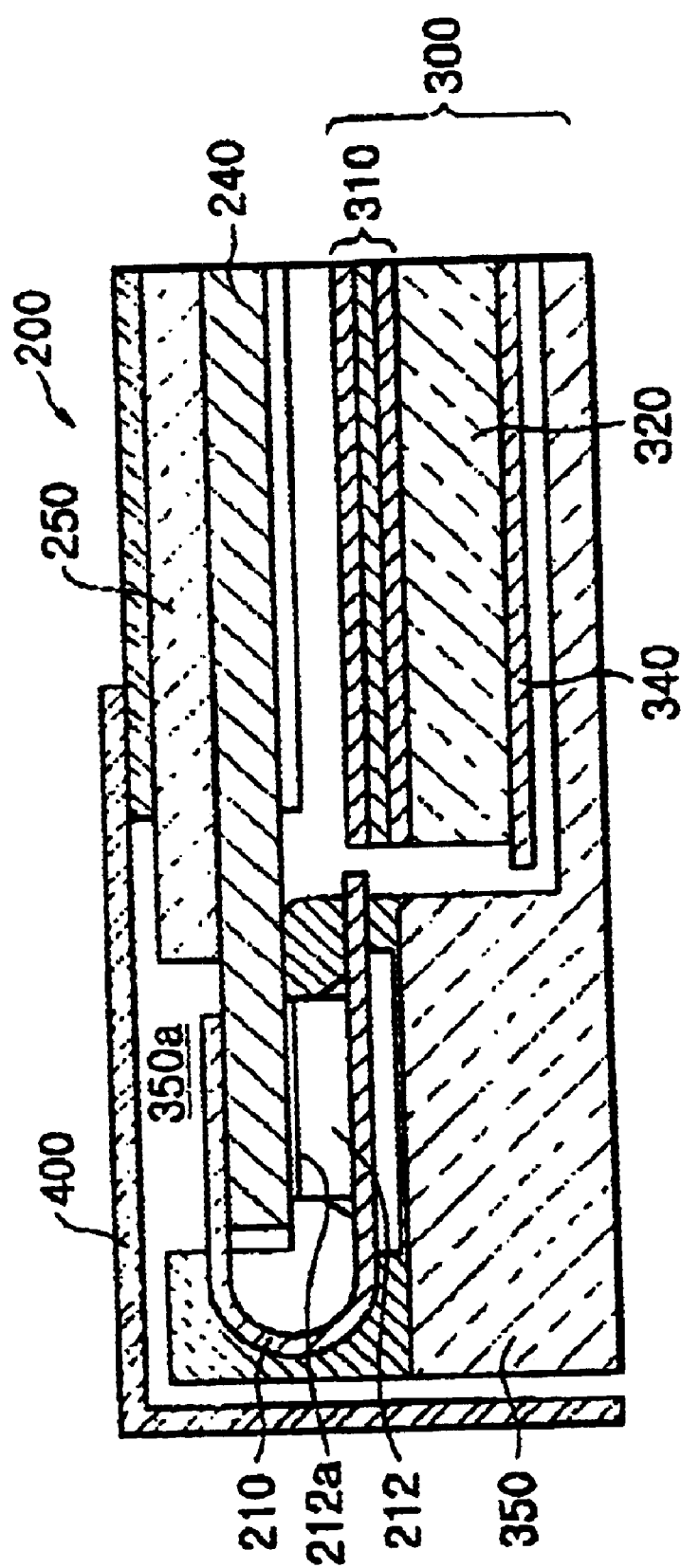
FIG. 8 is a partial sectional view of the liquid crystal display according to a preferred embodiment of the present invention.

FIG. 8 is a partial sectional view that can be handled easily showing a part of a liquid crystal display according to the present invention.

Referring to FIG. 8, a back light assembly 300 includes a mold frame 350. The mold frame 350 receives a light reflecting plate 340, a light guiding plate 320, and optical sheets 310 in the named order. The liquid crystal panel of the present invention is mounted on the optical sheets 310 and the perimeter region of the liquid crystal panel 200 is fixed by a chassis 400.

Here, a signal transmission film 210 one end of which is connected to the TFT substrate 240 is bent and a gate driver IC 212 of the signal transmission film 210 is attached to the rear surface of the TFT substrate 240 by a fixing means such as a double sided adhesive tape, an adhesive, or a clip.

The mold frame 350 has a receiving groove 350a that can accommodate the signal transmission film 210.

Meanwhile, although the above described embodiments show and describe the signal transmission films of the above-described configurations, a chip on flexible (COF) having more flexible base film than the base film of the flexible printed circuit may be also used.

Although FIG. 4 shows and describes that the gate driving signal transmission pattern 223 is integrated together with both of the data driving signal input pattern 224 and the data driving signal output pattern 225 on the data signal transmission film 226 of FIG. 4, only the gate driving signal transmission pattern 223 may be formed on an independent flexible base film no having a driving chip.

Figure 9:
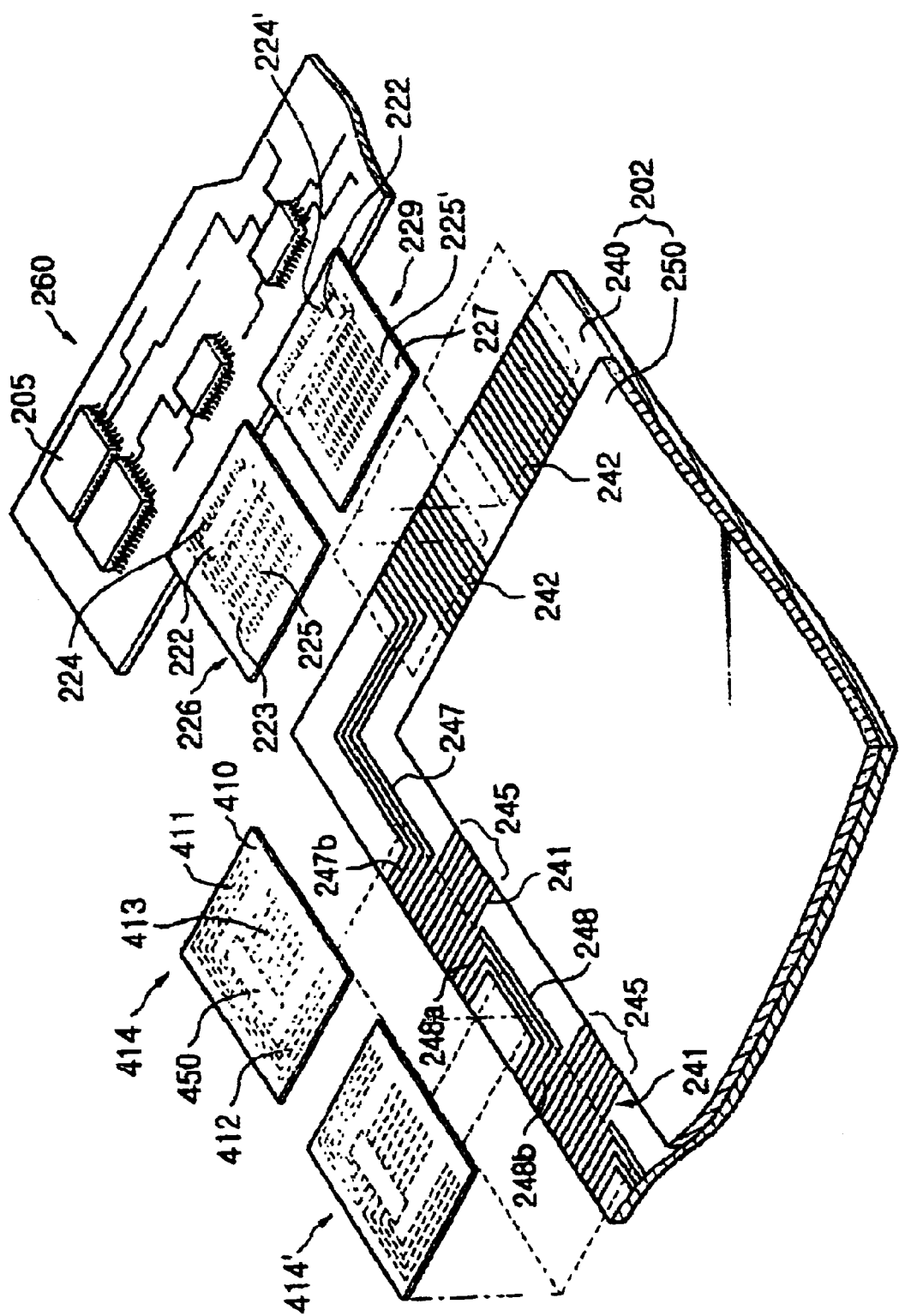
FIG. 9 is a partially exploded perspective view of the liquid crystal display panel according to another preferred embodiment of the present invention.

FIG. 9 is a partially exploded perspective view of an LCD panel in accordance with another preferred embodiment of the present invention.

Referring to FIG. 9, the LCD panel 202 comprises a TFT substrate 240 and a color filter substrate 250. The filter substrate 250 is smaller than the TFT substrate 240 and faces the TFT substrate 240. The TFT substrate 240 includes a gate line 241, a data line 242, a thin film transistor (not shown) and a pixel electrode (not shown).

Signal transmission films 226, 229, 414 and 414' are electrically coupled to the TFT substrate 240 and include a gate signal transmission film 414 and 414' and a data signal transmission film 226 and 229. The gate signal transmission films 414 and 414' are connected to the gate lines 241 on the TFT substrate 240. The data signal transmission films 226 and 229 are connected to the data lines 242.

The single integrated PCB 260, the color filter substrate 250, and the TFT substrate 240 have the same configuration as those of FIG. 4. Accordingly, their descriptions are intentionally omitted.

Hereinafter, the gate signal transmission films 414 and 414' will be described more fully referring to the accompanying drawings of FIG. 9 to FIG. 13.

The gate signal transmission film 414 is comprised of a base film 410, a gate driving signal input pattern 411, a first gate driving signal output pattern 413, a second gate driving signal output pattern 412, and a gate driver IC 450.

The gate driver IC 450 is disposed at the rear surface of the base film 410 in a flip chip type manner. The gate driving signal input pattern 411 receives the gate driving signal from the output terminal 247b of the first gate driving signal transmission line 247 and sends the signal to the gate driver IC 450.

Thus, the gate driving signal input pattern 411 has a curved shape twice bent at the right corner and a predetermined position of the upper edge. One end of the gate driving signal input pattern 411 is connected through an anisotropic conductive film (not shown) to the output terminal 247b of the first gate driving signal transmission line 247 and the other end of the gate driving signal input pattern 411 is connected to the input terminals (or input bumps) of the gate driver IC 450.

The first gate driving signal output pattern 413 has a linear shape and is formed in the base film 410 on which the gate driver IC 450 is disposed. One end of the first gate driving signal output pattern 413 is connected with output bumps of the gate driver IC 450 and the other end of the first gate driving signal output pattern 413 is connected through an anisotropic conductive film (not shown) to the gate lines group 245.

The second gate driving signal output pattern 412 has a curved shape twice bent at a predetermined position of the upper edge of the base film 410 and the left corner of the base film 410. The second gate driving signal output pattern 412 relays the gate driving signal from the TCP 226 to the input terminal 248a of the second gate driving signal transmission line 248 formed between the gate lines groups 245.

Figure 10:
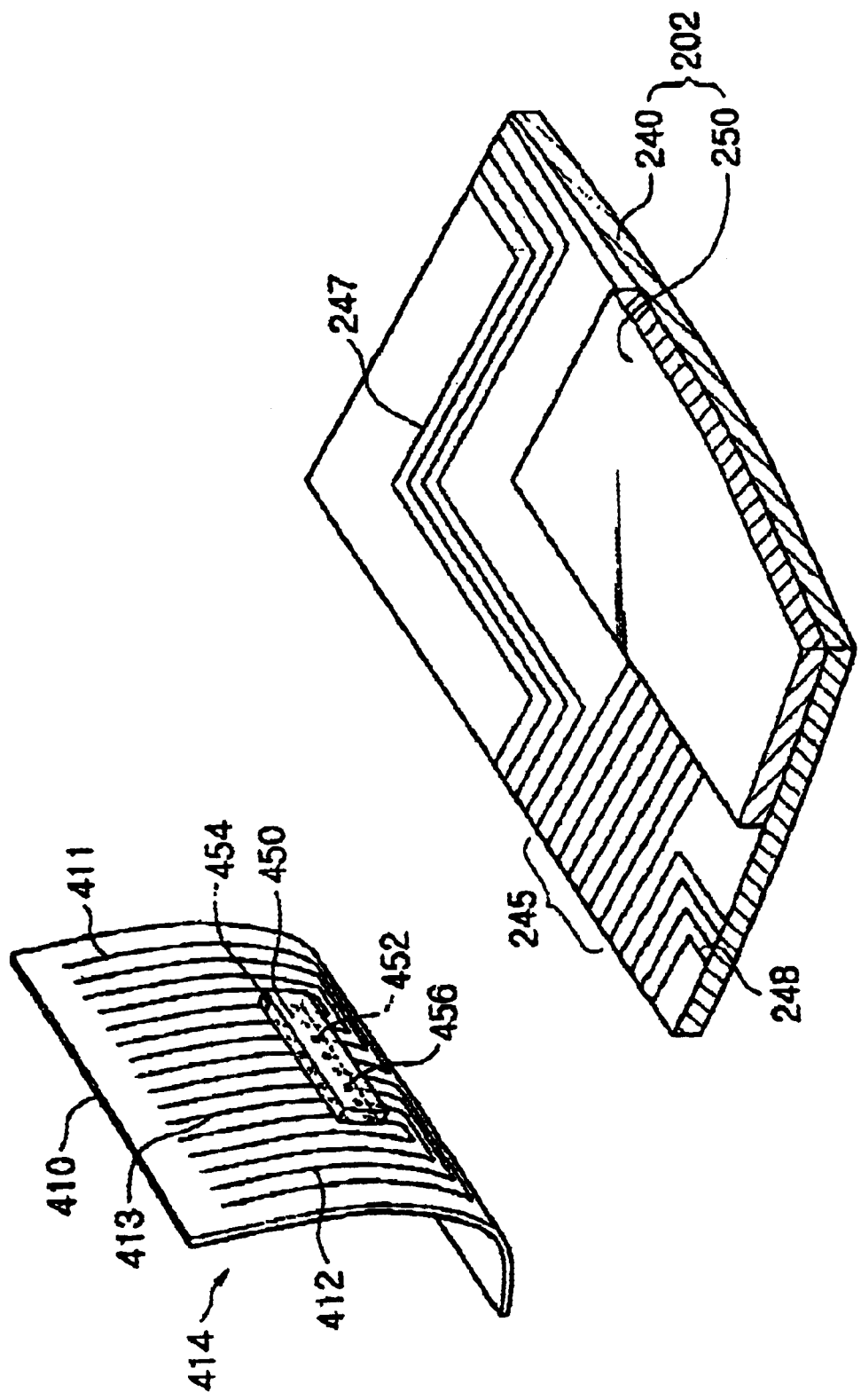
FIG. 10 is a partially exploded perspective view of the signal transmission film and the liquid crystal display panel of FIG. 9.

To realize this, one end of the second gate driving signal output pattern 412 is connected to second output bumps 452 of the gate driver IC 450 shown in FIG. 10 and the other end of the second gate driving signal output pattern 412 is connected through the anisotropic conductive film(not shown) to the input terminal 248a of the second gate driving signal transmission line 248.

In the above, the second gate driving signal output pattern 412 and the gate driving signal input pattern 411 are formed to be symmetric with respect to the gate driver IC 450.

And, as shown in the drawings, the gate driver IC 450, the gate driving signal input pattern 411, and the first and second gate driving signal output patterns 413, 412, for instance, are all formed on the rear surface of the base film 410.

FIG. 10 shows the structure of the gate driver IC 450 in accordance with one preferred embodiment of the present invention.

Referring to FIG. 10, the gate driver IC 450 comprises a main body 451, input bumps 452 arranged along one column of the main body and connected to the gate driving signal input pattern 411, first output bumps 454 arranged along another column and connected to the first gate driving signal output pattern 413 and second output bumps 456 connected to the second gate driving signal output pattern.

Figure 11:
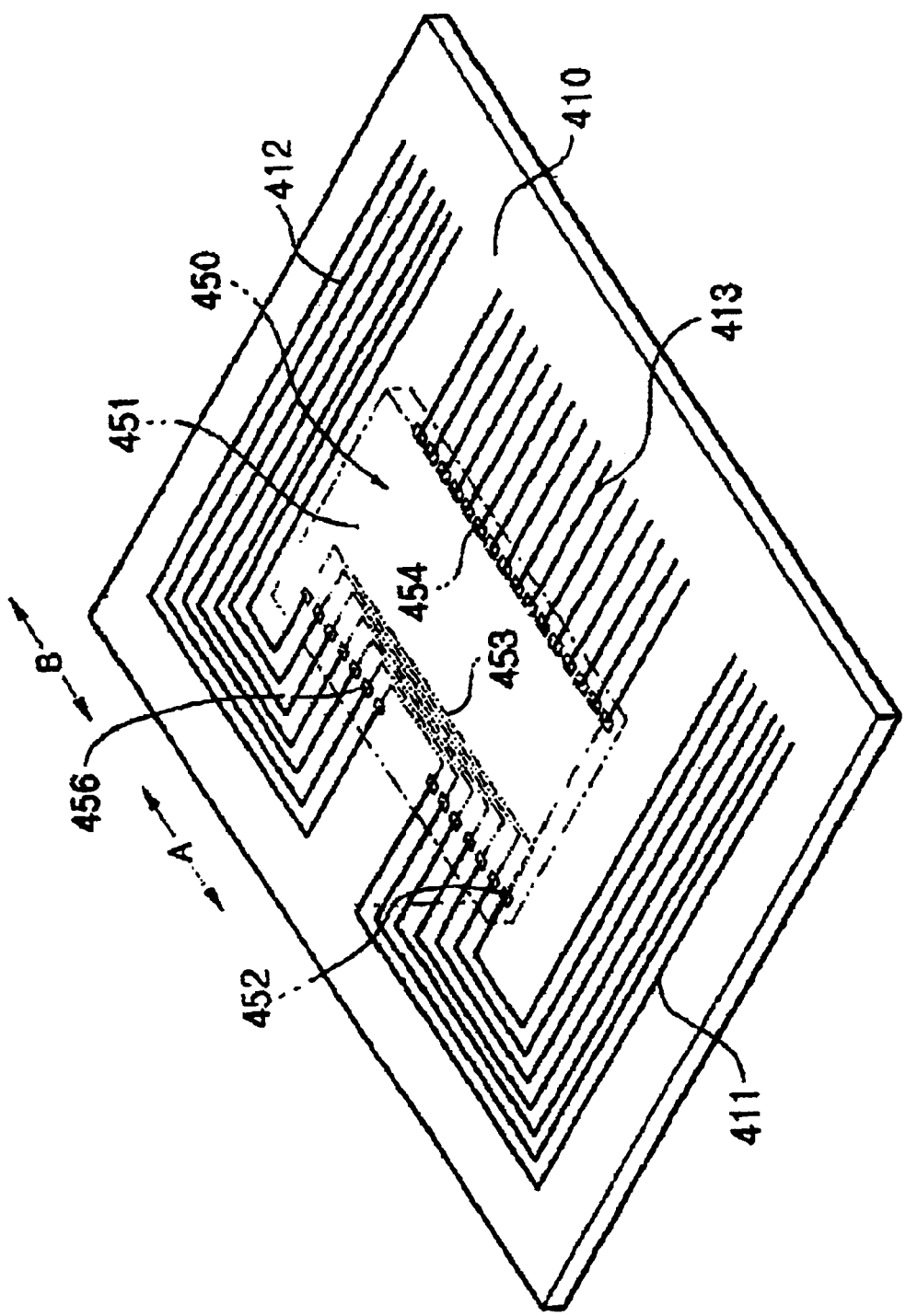
FIG. 11 is a rear perspective view of the signal transmission film of FIG. 9.

FIG. 11 is a plan view of the rear surface of the gate signal transmission film 414 of FIG.10.

As shown in FIG. 11, at least one of the input bumps 452 of group A is electrically connected to at least one of the second output bumps 456 in one-to-one correspondence.

To realize this, at least one metal line 453 is formed in the main body 451. In this embodiment, a plurality of metal lines 453 corresponding to the number of input bumps 452 are formed. The input bumps 452 have an electrical contact relation to the second output bumps 456 in one-to-one correspondence by the metal lines 453

When all of the input bumps 452 are in contact with all of the second output bumps 456, the input bumps 452 and the second output bumps 456 are arranged in a symmetric structure with respect to the gate driver IC 450, that is "mirror structure". At this time, the input bumps 452 and the second output bumps 456 have the same kinds and levels of signals. For instance, points P1 to P4 shown in FIG. 12 have the same kinds and levels of signals.

Hereinafter, the operation of the LCD having the above-mentioned configuration is described with reference to the accompanying drawings of FIG. 9 to FIG. 13.

When an image signal coming from an external information processing unit, i.e., a computer is input into the single integrated PCB 260, the single integrated PCB 260 generates gate driving signals and data driving signals responding to the input image signal.

The data driving signal generated from the single integrated PCB 260 is input into the data driver ICs 222 via the data driving signal input pattern 224 of the dual functioning signal transmission film 226 and the data driving signal input pattern 224' of the single functioning signal transmission film 229 and is then processed. Here, as the data driving signal, there are an STH (Start Horizontal) signal that precisely latches color data output from the computer unit into the data driver ICs 222, a Load signal that outputs the data latched by the data driver ICs 222 into the data lines 242 on the TFT substrate 240, a clock signal that transfers data, and a gray scale voltage that corresponds to color data of R, G, B.

The data driving signals processed in the data driver ICs 222 are input into the data lines 242 via the data driving signal output patterns 225 and 225'.

Simultaneously with the operation of the data driving signal, the gate driving signal generated from the single integrated PCB 260 is applied to the first gate signal transmission line 247 via the gate driving signal transmission pattern 223 that is formed on the base film 221 of the dual functioning signal transmission film 226 and is separate from the data driver IC 222.

At this time, the gate driving signal applied to the gate driving signal transmission line 247 comprises a shift signal, a gate clock signal, an output enable(OE) signal, a $V_{ON}$ signal which is a turn-on signal of the thin film transistor and a $V_{OFF}$ signal which is a turn-off signal of the thin film transistor. From among these signals, the OE signal allows the gate driver IC 450 to output signals processed therein to the gate lines 241 formed on the TFT substrate 240.

Figure 12:
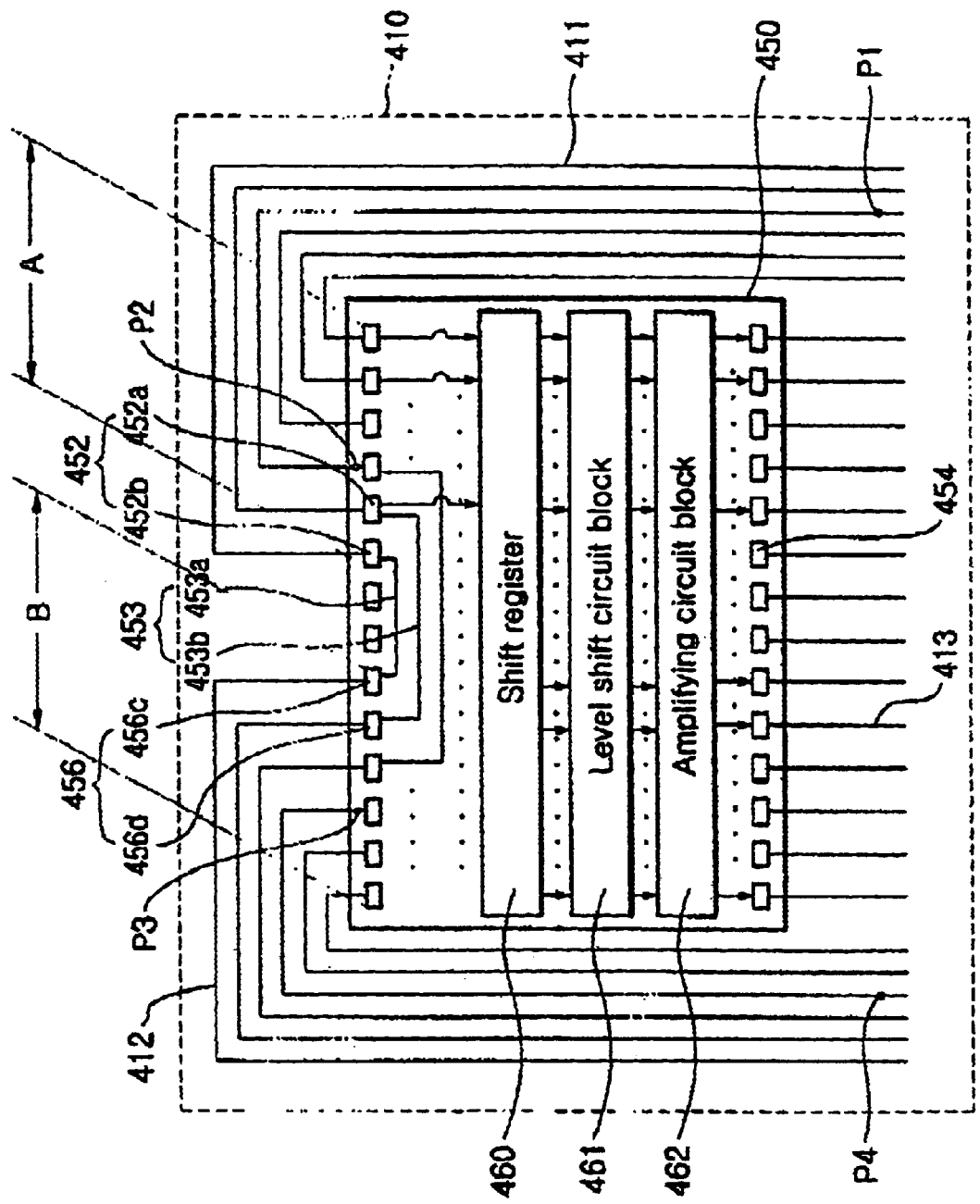
FIG. 12 is a detailed view of the gate driver IC of FIG. 9.

Meanwhile, the gate driving signal applied to the first gate driving signal transmission line 247 is transferred into the input bumps 452 via the gate driving signal input pattern 411 as shown in FIG. 12. In this case, input bumps 452 into which the gate driving signal are input are those 452a and 452b of the group A.

As previously described, the first input bumps 452a and 452b are connected with the second output bumps 456c and 456d of the group B in one-to-one correspondence by the metal lines 453a and 453b. Thus, when the gate driving signals are input into the first input bumps 452a and 452b, the same gate driving signals are also input into the second output bumps 456c and 456d through the metal lines 453a and 453b. As a result, the first input bumps 452a and 452b share the same gate driving signals with the second output bumps 456c and 456d.

At this time, the gate driving signals input via the gate driving signal input patterns 411, for instance, the $V_{ON}$ signal, the $V_{OFF}$ signal, the shift signal, the gate clock signal, etc., are applied to the second gate driving signal transmission line 248 via the second gate driving signal output pattern 412 before the OE signal is input into the input bumps of the gate driver IC 450.

The $V_{ON}$ signal, the $V_{OFF}$ signal, the shift signal, the gate clock signal, etc., applied to the second gate driving signal transmission line 248 are continuously supplied along the gate driving signal transmission path consisting of the gate driving signal input pattern 411, the input bumps 452 and the second gate driving signal output pattern 412 of each of the gate signal transmission films 414, 414' to gate driver IC of an adjacent signal transmission film. Thus, the gate driving signals are transferred into the gate driver IC with a flow of a swing type like an arrow "I" of FIG. 13. By such signal transmissions, all the gate driver ICs 450 are prepared to apply the gate driving signals to the gate lines.

Specifically, the shift signal and gate clock signal from among the gate driving signals are first input into a shift register 460 of the gate driver IC 450 as shown in FIG. 12. The shifter register 460 transfers the gate output signals of the $V_{ON}$ signal and $V_{OFF}$ signal applied to the input bumps 452 into a level shift circuit block 461 depending on the previously input gate clock signal.

The level shift circuit block 461 adjusts voltage levels of the $V_{ON}$ signal and the $V_{OFF}$ signal to appropriate values and then transfers the voltage level-adjusted $V_{ON}$ signal and $V_{OFF}$ signal into an amplifying circuit block 462.

Although the voltage level-adjusted $V_{ON}$ signal and $V_{OFF}$ signal are input into the amplifying circuit block 462 from the level shift circuit block 461, the amplifying circuit block 462 postpones a substantial output of the gate output signal until the OE signal is input.

Meanwhile, after the TFT turn-on signal, TFT turn-off signal, shift signal, gate clock signal have been applied to the gate driver ICs, as the OE signal is applied to the input bumps 452 of the gate driver ICs via the gate signal transmission path, the input bumps 452 transfers the applied OE signal to the amplifying circuit block 462. At this time, the amplifying circuit block 462 resumes the postponed transfer of the gate output signal and thereby the gate output signals are transferred into the first output bumps 454. Continuously, the gate driving signals are applied from the first output bumps 454 to the gate lines 241.

Figure 13:
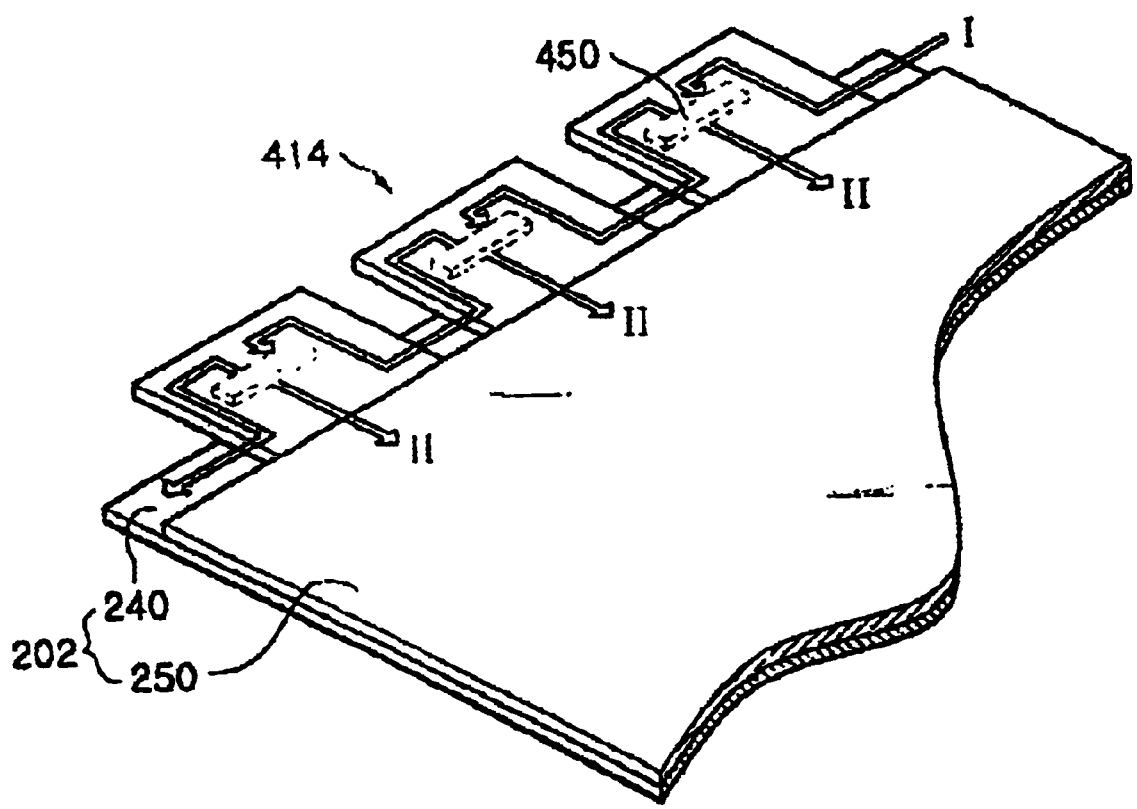
FIG. 13 is a schematic view describing the transmission path of the gate driving signals.

Here, as shown in FIG. 13, the gate driving signals are supplied along a linear path "II" between the first output bump 454 and the gate lines 241.

As the $V_{on}$ signal is input into gate terminals of thin film transistors placed along the rows through the gate lines 241, the thin film transistors are all turned on and the gray scale voltages which have been already applied to the data lines 242 are applied to the pixel electrodes. This generates an electric field proportional to the gray scale voltage, between the pixel electrode and the common electrode.

As the voltages are applied to the pixel electrodes, the liquid crystal interposed between the pixel electrode and the common electrode is re-arranged and the light transmittance changes accordingly. As a result, lights may pass through the TFT substrate 240 depending on the light transmittance. Thereafter, the light pass through the RGB elements formed on the color filter substrate 250 and displays an image. At this time, the electric field between the pixel electrode and the common electrode is maintained for a period of one frame in which all the gate lines 241 are turned on in order.

The above-described operations are performed very quickly and, thus, the liquid crystal display appears to display information in full color.

In the aforementioned embodiments, the signal transmission films can be made of tape carrier packages of chip on flexible (COF) type. And, although FIG. 9 shows and describes that the gate driving signal transmission pattern 223 is integrated together with both of the data driving signal input pattern 224 and the data driving signal output pattern 225 on the data signal transmission film 226, only the gate driving signal transmission pattern 223 may be formed on an independent flexible base film not having a driving chip.

As described above, the present invention can provide a compact size liquid crystal display by integrally processing gate and data driving signals using a single integrated PCB.

Moreover, using the single integrated PCB may eliminate the connector and a flexible printed circuit that is used for connecting two PCBs. As a result, spaces for the connector and the flexible printed circuit can be saved. Also, the whole assembly process is simplified.

While the present invention has been described in detail, it should be understood that various changes, substitutions and alterations can be made hereto without departing from the spirit and scope of the invention as defined by the appended claims.

What is claimed is:

1. A liquid crystal display panel assembly, comprising:
    a single integrated PCB for processing a gate driving signal and a data driving signal;
    an LCD panel comprising a color filter substrate, and a TFT substrate facing the color filter substrate including a plurality of gate line groups each having a plurality of gate lines extending to one edge of the TFT substrate, a plurality of data line groups each having a plurality of data lines extending to another adjacent edge, and a gate driving signal line placed between the plurality of gate line groups and the plurality of data line groups, that transfers the gate driving signals;
    a first signal transmission film including an integrated circuit for electrically connecting said single integrated PCB to the TFT substrate, applying the data driving signals to the plurality of data lines, and applying the gate driving signals to the plurality of gate lines, wherein the first signal transmission film has a first side and a second side and a portion of the first side is arranged on the TFT substrate and a portion of the second side is arranged on the single integrated PCB; and
    a second signal transmission film for electrically connecting the gate driving signal line to the plurality of gate lines, and applying the gate driving signals to the plurality of gate lines.

2. The liquid crystal display panel assembly of claim 1, wherein the gate driving signal line comprises a plurality of signal transferring lines formed on non-effective display region.

3. The liquid crystal display panel assembly of claim 2, wherein the signal transferring lines are made of thin metal film or indium tin oxide.

4. The liquid crystal display panel assembly of claim, 1 wherein said first signal transmission film comprises:
    a gate signal transmission portion having a gate driving signal transmission pattern for applying the gate driving signals from said single integrated PCB to the gate driving signal line; and
    a data signal transmission portion separated from said gate signal transmission portion and having a data driving signal transmission pattern for applying the data driving signals from said single integrated PCB to the plurality of data lines.

5. The liquid crystal display panel assembly of claim 4, wherein said first signal transmission film comprises:
    a base substrate;
    a gate driving signal transmission pattern formed on one sided face of said base substrate, wherein said integrated circuit is a data driver IC formed at one side of the base substrate, for processing the plurality of data driving signals input from the integrated PCB; and
    a data driving signal transmission pattern comprising a data driving signal input pattern and a data driving signal output pattern which are formed on the one side of the base substrate, one end of said data driving signal input pattern being connected to an input terminal of the data driving IC and one end of said data driving signal output pattern being connected to an output terminal of the data driving IC.

6. The liquid crystal display panel assembly of claim 5, wherein said base substrate is a flexible printed circuit film.

7. The liquid crystal display panel assembly of claim 1, wherein said second signal transmission film comprises:
    a flexible base substrate;
    a gate driver IC formed at one side of the flexible base substrate, for processing the gate driving signal input through the first signal transmission film from the integrated PCB; and
    a gate driving signal transmission pattern comprising a gate driving signal input pattern, a first gate driving signal output pattern, and a second gate driving signal output pattern all of which are formed on the one side of the base substrate,
    wherein the gate driving signal input pattern is connected to an input terminal of the gate driver IC,
    wherein the first gate driving signal output pattern by-passes a gate driving signal input through the first signal transmission film without a connection to the input and output terminals of the gate driver ICs, and
    wherein the second gate driving signal output pattern is connected to an output terminal of said gate driver IC.

8. A liquid crystal display, comprising:
    an LCD assembly, comprising:
        a single integrated PCB for processing a gate driving signal and a data driving signal; and
        an LCD panel comprising a color filter substrate and a TFT substrate facing the color filter substrate that includes a plurality of gate line groups each having a plurality of gate lines extending to one edge of the TFT substrate, a plurality of data line groups each having a plurality of data lines extending to another edge normal to the gate lines, a first gate driving signal transferring means placed between the plurality of gate lines and the plurality data lines that transfers one gate driving signals from one edge to another edge of the TFT substrate, and a second gate driving signal transferring means formed on the another edge of the TFT substrate;
    a first signal transmission film for electrically connecting said single integrated PCB to the TFT substrate, applying said data driving signals to a selected group of the plurality of data line groups, and applying the gate driving signals to the first gate driving signal transferring means, wherein the first signal transmission film includes an integrated circuit and the first signal transmission film has a first side and a second side and a portion of the first side is arranged on the TFT substrate and a portion of the second side is arranged on the single integrated PCB;

a second signal transmission film for applying the data driving signal to a non-selected line group of the plurality of data line groups;

a third signal transmission film for electrically connecting the first gate driving signal transferring means to one of the gate line groups, and applying the gate driving signal to the gate line groups; and a light supplying unit that supplies light to said LCD assembly.

9. The liquid crystal display of claim 8, wherein said first signal transmission film comprises:

a base substrate, wherein the integrated circuit is arranged on the base substrate and is a data driver IC formed for processing the data driving signal;

a gate driving signal pattern formed on said base substrate, for receiving the gate driving signal from said single integrated PCB; and a data driving signal pattern comprising a data driving signal input pattern formed in an input terminal of said data driver IC that receives the data driving signal from said single integrated PCB, and a data driving signal output pattern formed in an output terminal of said data driver IC.

10. The liquid crystal display of claim 8, wherein said third signal transmission film comprises:

a base substrate;

a gate driver IC formed on said base substrate for processing the gate driving signal;

a gate driving signal input pattern-formed on said base substrate and having one end connected to input terminals of said gate driver IC and the other end is connected to output terminal of the first gate driving signal transferring means such that the gate driving signals is input from said single integrated PCB to said gate driver IC;

a first output pattern one end of which is connected to an output terminal of said gate driver IC and other end of which is connected to an input terminal of the gate line groups such that the gate driving signal processed in said gate driver IC is input into the gate line groups; and a second output pattern one end of which is connected to an input terminal of the first gate driving signal transferring means and other end of which is connected to an input terminal of the second gate driving signal transferring means such that the gate driving signal is input to the third signal transmission film.

11. The liquid crystal display of claim 10, wherein said first output pattern is connected to the first gate driving signal transferring means and said second output pattern is connected to the second driving signal transferring means.

12. The liquid crystal display of claim 10, wherein said first output pattern is connected to the second gate driving signal transferring means and said second output pattern is connected to the first driving signal transferring means.

13. The liquid crystal display of claim 9, wherein said base substrate is a flexible printed circuit film.

14. A liquid crystal display, comprising:

an LCD assembly, comprising:

an LCD panel, comprising:

a color filter substrate; and a TFT substrate facing the color filter substrate, that includes a plurality of gate line groups each having a plurality of gate lines extending to one edge of the TFT substrate, a plurality of data line groups each having a plurality of data lines extending to another edge normal to the plurality of gate lines, and a gate driving signal line placed between the plurality of gate line groups and the plurality of data line groups;

a plurality of signal transmission films comprising a gate signal transmission film connected to the plurality of gate line groups and a data signal transmission film connected to the plurality of data line groups;

a single integrated PCB connected to the data signal transmission film for processing a gate driving signal and a data driving signal;

a gate driving signal transferring means for transferring the gate driving signal of said single integrated PCB into the plurality of gate line groups via the data signal transmission film, the TFT substrate, and the gate signal transmission film in the named order;

a data driving signal transferring means for transferring the data driving signal of said single integrated PCB into the plurality of data line groups via the data signal transmission film; and a light supplying unit that supplies light to said LCD assembly.

15. The liquid crystal display of claim 14, wherein said gate driving signal transferring means is a conductive signal transmission line that connects said single integrated PCB to the gate signal transmission films in parallel with respect to the LCD panel.

16. The liquid crystal display of claim 15, wherein said gate driving signal transferring means is a conductive signal transmission line a diameter of which increases in proportion to the length thereof.

17. The liquid crystal display of claim 15, wherein said gate driving signal transferring means is a conductive signal transmission line connected to a resistor that controls transmission speed of the gate driving signal.

18. The liquid crystal display of claim 17, wherein the resistor is a variable resistor and is formed on said single integrated PCB.

19. The liquid crystal display of claim 15, wherein said gate driving signal transferring means is a conductive signal transmission line and the gate driving signal is applied differently depending on the length of the conductive signal transmission line.

20. The liquid crystal display of claim 19, wherein said gate driving signal transferring means has a signal level that is proportional to total length of the conductive signal transmission line.

21. A method for assembling said liquid crystal display of claim 8, comprising the steps of:

connecting one end of said third signal transmission film to said TFT substrate and then bending the other end of said third signal transmission film toward the rear surface of said TFT substrate; and fixing other end of said third signal transmission film to the rear surface of said TFT substrate.

22. The method of claim 21, wherein said third signal transmission film is fixed by a fixing means.

23. The method of claim 22, wherein the fixing means is one selected from a group consisting of a double sided adhesive tape, adhesive, and a clip.

24. A liquid crystal display panel, comprising:

a single integrated PCB for processing a gate driving signal and a data driving signal;

an LCD panel comprising:

a color filter substrate; and a TFT substrate including a plurality of gate line groups each having a plurality of gate lines extending to an edge of the TFT substrate, a plurality of data line groups each having a plurality of data lines extending to another edge, and a gate driving signal line placed between the plurality of gate line groups and the plurality of data line groups, that transfers the gate driving signals; and a signal transmission film for electrically connecting said single integrated PCB to the TFT substrate and for simultaneously applying the data driving signals to the plurality of data lines and applying the gate driving signals to the gate driving signal line, wherein the signal transmission film includes an integrated circuit and the signal transmission film has a first side and a second side and a portion of the first side is arranged on the TFT substrate and a portion of the second side is arranged on the single integrated PCB.

25. A liquid crystal display panel, comprising:

a single integrated PCB for generating a gate driving signal and a data driving signal;

an LCD panel comprising:
  a color filter substrate; and
  a TFT substrate including a plurality of gate line groups each having a plurality of gate lines extending to an edge of the TFT substrate, a plurality of data line groups each having a plurality of data lines extending to another edge, and a gate driving signal line placed between the plurality of gate line groups and the plurality of data line groups, that transfers the gate driving signals; and a first signal transmission film for electrically connecting said single integrated PCB to the TFT substrate and for applying the data driving signals to the plurality of data lines and applying the gate driving signals to the gate driving signal line, wherein the signal transmission film includes a data driver IC and the signal transmission film has a first side and a second side and a portion of the first side is arranged on the TFT substrate and a portion of the second side is arranged on the single integrated PCB.

26. The liquid crystal display panel of claim 22, further comprising:

a second signal transmission film for electrically connecting the gate driving signal line to the plurality of gate lines, and applying the gate driving signals to the plurality of gate lines.

27. A liquid crystal display, comprising:

a color filter substrate; and a TFT substrate facing the color filter substrate, that includes a plurality of gate line groups each having a plurality of gate lines extending to one edge of the TFT substrate, a plurality of data line groups each having a plurality of data lines extending to another edge normal to the plurality of gate lines, and a gate driving signal line placed between the plurality of gate line groups and the plurality of data line groups, wherein a portion of the gate driving signal line extends under a portion of one of a plurality of signal transmission films, wherein the plurality of signal transmission films comprises a data signal transmission film and a gate signal transmission film connected to the plurality of gate line groups and a data signal transmission film connected to the plurality of data line groups, wherein the data signal transmission film includes a data driver IC and the data signal transmission film has a first side and a second side and a portion of the first side is arranged on the TFT substrate and a portion of the second side is arranged on a single integrated PCB, and wherein the single integrated PCB processes a gate driving signal and a data driving signal;

and a light supplying unit for providing light to the liquid crystal display.

* * * * *

UNITED STATES PATENT AND TRADEMARK OFFICE
CERTIFICATE OF CORRECTION

PATENT NO. : 6,664,942 B1
DATED : December 16, 2003
INVENTOR(S) : Sang-Soo Kim et al.

It is certified that error appears in the above-identified patent and that said Letters Patent is hereby corrected as shown below:

<u>Column 16,</u>
Line 1, replace the term "claim 4" with the term -- claim 1 --.

Signed and Sealed this

Sixteenth Day of March, 2004

JON W. DUDAS
*Acting Director of the United States Patent and Trademark Office*